(12) United States Patent
Lee

(10) Patent No.: US 7,633,803 B2
(45) Date of Patent: Dec. 15, 2009

(54) METHODS OF OPERATING MEMORY DEVICES INCLUDING NEGATIVE INCREMENTAL STEP PULSE PROGRAMMING AND RELATED DEVICES

(75) Inventor: Seungwon Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 191 days.

(21) Appl. No.: 12/021,805

(22) Filed: Jan. 29, 2008

(65) Prior Publication Data

US 2008/0279012 A1    Nov. 13, 2008

(30) Foreign Application Priority Data

May 10, 2007    (KR) ..................... 10-2007-0045568

(51) Int. Cl.
   *G11C 16/04*    (2006.01)
(52) U.S. Cl. ........................ 365/185.19; 365/185.17; 365/185.18; 365/185.21; 365/185.22
(58) Field of Classification Search ............ 365/185.18, 365/185.19, 185.17, 185.21, 185.22
   See application file for complete search history.

(56) References Cited

U.S. PATENT DOCUMENTS

| | | | |
|---|---|---|---|
| 5,473,563 | A | 12/1995 | Suh et al. |
| 5,642,309 | A | 6/1997 | Kim et al. |
| 5,696,717 | A | 12/1997 | Koh |
| 5,781,483 | A | 7/1998 | Shore |
| 5,812,457 | A | 9/1998 | Arase |
| 6,005,804 | A | 12/1999 | Hollmer et al. |
| 6,522,580 | B2 | 2/2003 | Chen et al. |

(Continued)

FOREIGN PATENT DOCUMENTS

JP    7-57486 A    3/1995

(Continued)

OTHER PUBLICATIONS

United Kingdom Search Report (5 pages) corresponding to United Kingdom Patent Application No. GB0808456.8; Dated: Aug. 28, 2008.

(Continued)

*Primary Examiner*—Richard Elms
*Assistant Examiner*—Eric Wendler
(74) *Attorney, Agent, or Firm*—Myers Bigel Sibley & Sajovec, P. A.

(57) ABSTRACT

A memory device may include a plurality of memory cell transistors serially coupled in a string between a string selection transistor and a ground selection transistor. Moreover, the string selection transistor may be coupled between the string and a bitline, and the ground selection transistor may be coupled between the string and a common source line. During programming, one of the plurality of memory cell transistors in the string may be selected for a program operation so that other memory cell transistors in the string are unselected, and a plurality of negative voltage pulses may be applied to a channel region of the selected memory cell transistor. While applying the plurality of negative voltage pulses to the channel region, a positive pass voltage may be applied to control gate electrodes of the unselected memory cell transistors, and a positive program voltage may be applied to a control gate electrode of the selected memory cell. Related methods and devices are discussed.

25 Claims, 13 Drawing Sheets

U.S. PATENT DOCUMENTS

| | | |
|---|---|---|
| 6,671,204 B2 | 12/2003 | Im |
| 2002/0060926 A1* | 5/2002 | Choi et al. ............. 365/185.17 |
| 2002/0158282 A1 | 10/2002 | Li et al. |
| 2006/0050561 A1* | 3/2006 | Guterman et al. ...... 365/185.19 |
| 2006/0140012 A1 | 6/2006 | Wan et al. |
| 2006/0171209 A1 | 8/2006 | Sim et al. |
| 2006/0227618 A1 | 10/2006 | Lee |
| 2007/0002629 A1 | 1/2007 | Lee et al. |
| 2007/0081388 A1 | 4/2007 | Joo |
| 2008/0151633 A1* | 6/2008 | Park et al. ............. 365/185.19 |
| 2009/0097321 A1* | 4/2009 | Kim et al. ............. 365/185.18 |

FOREIGN PATENT DOCUMENTS

| | | |
|---|---|---|
| KR | 1020050073297 A | 7/2005 |
| KR | 1020060040381 A | 5/2006 |
| KR | 10-2007-0000525 A | 1/2007 |
| KR | 1020070002411 A | 1/2007 |
| KR | 10-2007-0034305 A | 3/2007 |
| WO | WO 2004/061861 A2 | 7/2004 |
| WO | WO 2004/061861 A3 | 7/2004 |

OTHER PUBLICATIONS

128M × 8 Bit NAND Flash Memory, K9K1G08R0B, K9K1G08B0B, K9K1G08U0B, Samsung Electronics Co., Ltd., 41 pages, Mar. 17, 2003.

* cited by examiner

|  | STEP0 | STEP1 | STEP2 | STEP3 |
|---|---|---|---|---|
| $V_{pgm}$ | 10V | 10V | 10V | ... |
| PGM BL | -4.70V | -4.85V | -5.00V | ... |

|  | STEP0 | STEP1 | STEP2 | STEP3 |
|---|---|---|---|---|
| Vpass | 4.5V | 4.5V | 4.5V | ... |
| PGM BL | -4.70V | -4.85V | -5.00V | ... | ns
METHODS OF OPERATING MEMORY DEVICES INCLUDING NEGATIVE INCREMENTAL STEP PULSE PROGRAMMING AND RELATED DEVICES

RELATED APPLICATIONS

This U.S. non-provisional patent application claims the benefit of priority under 35 U.S.C. § 119 of Korean Patent Application No. 10-2007-0045568, filed on May 10, 2007, the disclosure of which is hereby incorporated herein by reference in its entirety.

FIELD OF THE INVENTION

The present invention generally relates to electronic memories, and more particularly, to methods of programming electronic memories and related devices.

BACKGROUND

Flash memories may be configured as NOR flash memories or as NAND flash memories. In a NOR flash memory, the memory cells are connected to the bitlines in parallel so that if any memory cell is turned on by the corresponding wordline, the bitline goes low. In a NAND flash memory, a number of transistors are connected in series so that a NAND flash memory structure may provide a higher density of memory cells than may be provided in a NOR flash memory. Moreover, NAND flash memories may provide faster programming and erasing times than may be provided by NOR flash memories.

NAND flash memory structures are discussed, for example, in U.S. Pat. No. 5,473,563 to Suh et al. entitled "Nonvolatile Semiconductor Memory" and assigned to the assignee of the present application. As discussed in the '563 Suh patent, a NAND structured flash memory may include a first selection transistor with a drain connected to a corresponding bitline via a contact hole, a second selection transistor with a source connected to a common source line, and eight memory transistors with channels connected in series between a source of the first selection transistor and a drain of the second selection transistor. The first and second selection transistors and the eight memory transistors may be formed on a p-type semiconductor substrate, and each memory transistor may include a floating gate layer formed on a gate oxide layer over a channel region between its source and drain regions and a control gate layer separated from the floating gate layer by an intermediate insulating layer. To program or write a selected one of the memory transistors, an operation of simultaneously erasing all of the memory transistors may be followed by programming the selected memory transistor.

When programming a selected memory transistor, a program voltage may be applied to a selected wordline of a selected memory block (corresponding to the selected memory cell) and a pass voltage may be applied to unselected wordlines of the selected memory block (corresponding to unselected memory cells). Channel regions and source and drain junctions of memory transistors of cell units in the selected memory block may be charged to a program inhibition voltage. Channel regions and source and drain junctions of cell units associated with memory transistors programmed to the other binary data may be discharged to be programmed while those of cell units associated with nonprogrammed memory transistors may be maintained at the program inhibition voltage to prevent programming.

A flash memory device may include Single-Level Cell (SLC) transistors or Multi-Level Cell (MLC) transistors depending on a number of data bits stored in each memory cell transistor. One (1) bit of data having a logic value of "1" or "0" can be stored in an SLC transistor. Two (2) bits of data having a logic value of "11", "10", "01" or "00" can be stored in an MLC transistor. Therefore, flash memory devices including MLC transistors may provide more highly integrated semiconductor devices for increased capacity.

Incremental Step Pulse Programming (ISPP) has been developed to increase program speeds for flash memory devices including MLC transistors. With Incremental Step Pulse Programming, a threshold voltage of a selected MLC transistor is changed to a voltage corresponding to a data value to be stored (any one of "11", "10" "01" and "00").

SUMMARY

According to some embodiments of the present invention, a memory device may include a plurality of memory cell transistors serially coupled in a string between a string selection transistor and a ground selection transistor. The string selection transistor may be coupled between the string and a bitline, and the ground selection transistor may be coupled between the string and a common source line. One of the plurality of memory cell transistors in the string may be selected as a selected memory cell transistor for a program operation so that other memory cell transistors in the string are unselected. During the program operation, a plurality of negative voltage pulses may be applied to a channel region of the selected memory cell transistor. While applying the plurality of negative voltage pulses to the channel region, a positive pass voltage may be applied to control gate electrodes of the unselected memory cell transistors, and a positive program voltage may be applied to a control gate electrode of the selected memory cell.

The plurality of negative voltage pulses may be applied to the channel region of the selected memory cell transistor through the bitline. The memory cells, the string selection transistor, and the ground selection transistor may be provided on a well region, and applying the plurality of negative voltage pulses to the channel region of the selected memory cell transistor may include applying the plurality of negative voltage pulses through the well region while the string selection transistor is turned off.

The memory device may include a second plurality of memory cell transistors serially coupled in a second string between a second string selection transistor and a second ground selection transistor. The second string selection transistor may be coupled between the second string and a second bitline, and the second ground selection transistor may be coupled between the second string and the common source line. One of the second plurality of memory cell transistors in the second string may be selected as a second selected memory cell transistor for the program operation so that other memory cell transistors in the second string are unselected, and control gate electrodes of the first and second selected memory cell transistors may be electrically connected through a shared wordline. During the program operation, the plurality of negative voltage pulses may be applied to channel regions of the first and second selected memory cell transistors. While applying the plurality of negative voltage pulses to the channel regions, the positive pass voltage may be applied to control gate electrodes of the unselected memory cell transistors of the first and second strings, and the positive program voltage may be applied through the shared wordline to control gate electrodes of the first and second selected memory cell transistors.

The memory device may include a second plurality of memory cell transistors serially coupled in a second string between a second string selection transistor and a second ground selection transistor. The second string selection transistor is coupled between the second string and a second bitline, and the second ground selection transistor is coupled between the second string and the common source line. One of the second plurality of memory cell transistors in the second string may be selected as a second selected memory cell transistor for the program operation so that other memory cell transistors in the second string are unselected, and control gate electrodes of the first and second selected memory cell transistors may be electrically connected through a shared wordline. During the program operation while applying the plurality of negative voltage pulses to the channel region of the first selected memory cell transistor, a program inhibit voltage may be applied to the channel region of the second selected memory cell transistor. While applying the plurality of negative voltage pulses to the channel region of the first selected memory cell transistor, the positive pass voltage may be applied to control gate electrodes of the unselected memory cell transistors of the first and second strings, and a positive program voltage may be applied through the shared wordline to control gate electrodes of the first and second selected memory cell transistors.

The positive program voltage may be applied as a plurality of pulses with each pulse of the positive program voltage having a magnitude that is substantially constant relative to a reference voltage received from outside the memory device. A negative voltage pulse of the plurality of negative voltage pulses may be more negative than a preceding negative voltage pulse, a difference between successive negative voltage pulses may be about 0.15 volts, and/or the negative voltage pulses may be in the range of about negative 2 volts to about negative five volts.

The positive pass voltage may be applied to the control gate electrodes of the unselected memory cell transistors as a plurality of pulses with each pulse of the positive pass voltage having a magnitude that is substantially constant while applying the plurality of negative voltage pulses to the channel region. More particularly, the magnitude of each pulse of the positive pass voltage may be in the range of about 4 volts to about 5 volts.

Applying the positive pass voltage to the control gate electrodes of the unselected memory cell transistors may include applying increasing positive pass voltage pulses while applying successive negative voltage pulses to the channel region. A difference between successive positive pass voltage pulses may be about 0.15 volts, and/or the increasing positive pass voltage pulses may be in the range of about 2 volts to about 5 volts.

Differences between magnitudes of the positive pass voltage and the positive program voltage may remain substantially constant while applying successive negative voltage pulses to the channel region. A first difference between magnitudes of the positive pass voltage and a first of the negative voltage pulses while applying the first of the negative voltage pulses to the channel region may be different than a second difference between magnitudes of the positive pass voltages and a second of the negative voltage pulses while applying the second of the negative voltage pulses to the channel region. A program verification operation may be performed after applying each of the plurality of negative voltage pulses to the channel region, and application of further negative voltage pulses to the channel region may be terminated upon passing the program verification operation.

According to other embodiments of the present invention, a memory device may include a plurality of memory cell transistors serially coupled in a string between a string selection transistor and a ground selection transistor. The string selection transistor may be coupled between the string and a bitline, and the ground selection transistor may be coupled between the string and a common source line. One of the plurality of memory cell transistors in the string may be selected as a selected memory cell transistor for a program operation so that other memory cell transistors in the string are unselected. During the program operation, a plurality of voltage pulses may be applied to a channel region of the selected memory cell transistor. While applying the plurality of voltage pulses to the channel region, a pass voltage may be applied to control gate electrodes of the unselected memory cell transistors, a difference between a voltage pulse applied to the channel region and the pass voltage applied to control gate electrodes of the unselected memory cell transistors may change with successive voltage pulses applied to the channel region. In addition, a program voltage may be applied to a control gate electrode of the selected memory cell while applying the plurality of voltage pulses to the channel region.

Applying the plurality of voltage pulses to the channel region of the selected memory cell transistor may include applying the plurality of voltage pulses through the bitline. The memory cells, the string selection transistor, and the ground selection transistor may be provided on a well region, and applying the plurality of voltage pulses to the channel region of the selected memory cell transistor may include applying the plurality of voltage pulses through the well region while the string selection transistor is turned off.

A difference between a voltage pulse applied to the channel region and the pass voltage applied to control gate electrodes of the unselected memory cell transistors may increase with successive voltage pulses applied to the channel region. Applying the plurality of voltage pulses to the channel region may include applying a plurality of negative voltage pulses to the channel region, and applying the pass voltage to the control gate electrodes of the unselected memory cell transistors may include applying a positive pass voltage to the control gate electrodes. The program voltage may be applied as a plurality of pulses with each pulse of the program voltage having a magnitude that is substantially constant relative to a reference voltage received from outside the memory device.

A voltage pulse of the plurality of voltage pulses may be less than a preceding voltage pulse, a difference between successive voltage pulses may be about 0.15 volts, and the voltage pulses may be in the range of about negative 2 volts to about negative five volts. The pass voltage may be applied to the control gate electrodes of the unselected memory cell transistors as a plurality of pulses with each pulse of the pass voltage having a magnitude that is substantially constant while applying the plurality of voltage pulses to the channel region, and the magnitude of each pulse of the pass voltage may be in the range of about 4 volts to about 5 volts.

Applying the pass voltage to the control gate electrodes of the unselected memory cell transistors may include applying increasing pass voltage pulses while applying successive voltage pulses to the channel region. A difference between successive pass voltage pulses may be about 0.15 volts, and/or the increasing pass voltage pulses may be in the range of about 2 volts to about 5 volts.

Differences between magnitudes of the pass voltage and the program voltage may remain substantially constant while applying successive voltage pulses to the channel region. A first difference between magnitudes of the pass voltage and a first of the voltage pulses while applying the first of the voltage pulses to the channel region may be different than a second difference between magnitudes of the pass voltage and a second of the voltage pulses while applying the second of the voltage pulses to the channel region. A program verification operation may be performed after applying each of the plurality of voltage pulses to the channel region, and application of further voltage pulses to the channel region may be terminated upon passing the program verification operation.

According to still other embodiments of the present invention, an electronic device may include a memory cell array and a controller electrically coupled to the memory cell array. The memory cell array may include a plurality of memory cell transistors serially coupled in a string between a string selection transistor and a ground selection transistor. The string selection transistor may be coupled between the string and a bitline, and the ground selection transistor may be coupled between the string and a common source line. The controller may be configured to select one of the plurality of memory cell transistors in the string as a selected memory cell transistor for a program operation so that other memory cell transistors in the string are unselected. A plurality of negative voltage pulses may be applied to a channel region of the selected memory cell transistor during the program operation. While applying the plurality of negative voltage pulses to the channel region, a positive pass voltage may be applied to control gate electrodes of the unselected memory cell transistors, and a positive program voltage may be applied to a control gate electrode of the selected memory cell while applying the plurality of negative voltage pulses to the channel region.

The controller may be configured to apply the plurality of negative voltage pulses through the bitline. The memory cells, the string selection transistor, and the ground selection transistor may be provided on a well region, and the controller may be configured to apply the plurality of negative voltage pulses through the well region while the string selection transistor is turned off. The controller may be configured to apply the positive program voltage as a plurality of pulses with each pulse of the positive program voltage having a magnitude that is substantially constant relative to a reference voltage received from outside the electronic device.

A negative voltage pulse of the plurality of negative voltage pulses may be more negative than a preceding negative voltage pulse, a difference between successive negative voltage pulses may be about 0.15 volts, and/or the negative voltage pulses may be in the range of about negative 2 volts to about negative five volts. The controller may be configured to apply the positive pass voltage to the control gate electrodes of the unselected memory cell transistors as a plurality of pulses with each pulse of the positive pass voltage having a magnitude that is substantially constant while applying the plurality of negative voltage pulses to the channel region, and the magnitude of each pulse of the positive pass voltage may be in the range of about 4 volts to about 5 volts.

The controller may be configured to apply the positive pass voltage as increasing positive pass voltage pulses to the control gate electrodes of the unselected memory cell transistors while applying successive negative voltage pulses to the channel region, a difference between successive positive pass voltage pulses is about 0.15 volts, and/or the positive pass voltage pulses may be in the range of about 2 volts to about 5 volts.

Differences between magnitudes of the positive pass voltage and the positive program voltage may remain substantially constant while applying successive negative voltage pulses to the channel region. A first difference between magnitudes of the positive pass voltage and a first of the negative voltage pulses while applying the first of the negative voltage pulses to the channel region may be different than a second difference between magnitudes of the positive pass voltage and a second of the negative voltage pulses while applying the second of the negative voltage pulses to the channel region. The controller may be further configured to perform a program verification operation after applying each of the plurality of negative voltage pulses to the channel region, and to terminate application of further negative voltage pulses to the channel region upon passing the program verification operation.

An interface may be electrically coupled to the controller, and the interface may provide a detachable electrical and mechanical coupling with a microprocessor. A radio interface may be electrically coupled to the controller, and the radio interface may provide a wireless coupling with a microprocessor. A bus may be electrically coupled to the controller, and a microprocessor may be electrically coupled to the bus with the microprocessor being configured to provide data over the bus to the controller to be programmed in the memory cell array. A user interface may be electrically coupled to the bus, and the user interface may be configured to provide data to the microprocessor and to receive data from the microprocessor.

The memory cell array may include a plurality of wordlines with each of the wordlines coupled to a respective one of the memory cell transistors in the string. The controller may include a row decoder coupled to the wordlines and a page buffer coupled to the bitline. The controller may be configured to apply the program and pass voltages from the row decoder over respective wordlines and to apply the plurality of negative program voltage pulses from the page buffer over the bitline.

According to yet other embodiments of the present invention, an electronic device may include a memory cell array and a controller electrically coupled to the memory cell array. The memory cell array may include a plurality of memory cell transistors serially coupled in a string between a string selection transistor and a ground selection transistor. The string selection transistor may be coupled between the string and a bitline, and the ground selection transistor may be coupled between the string and a common source line. The controller may be configured to select one of the plurality of memory cell transistors in the string as a selected memory cell transistor for a program operation so that other memory cell transistors in the string are unselected. A plurality of voltage pulses may be applied to a channel region of the selected memory cell transistor during the program operation. While applying the plurality of voltage pulses to the channel region, a pass voltage may be applied to control gate electrodes of the unselected memory cell transistors, and a program voltage may be applied to a control gate electrode of the selected memory cell. More particularly, a difference between a voltage pulse applied to the channel region and the pass voltage applied to control gate electrodes of the unselected memory cell transistors may change with successive voltage pulses applied to the channel region.

The controller may be configured to apply the plurality of voltage pulses through the bitline. The memory cells, the string selection transistor, and the ground selection transistor may be provided on a well region, and the controller may be configured to apply the plurality of voltage pulses through the well region while the string selection transistor is turned off. A difference between a voltage pulse applied to the channel region and the pass voltage applied to control gate electrodes of the unselected memory cell transistors may increase with successive voltage pulses applied to the channel region.

The controller may be configured to apply the voltage pulses as a plurality of negative voltage pulses to the channel region, and to apply the pass voltage as a positive pass voltage to the control gate electrodes. The controller may be configured to apply the program voltage as a plurality of pulses with each pulse of the program voltage having a magnitude that is substantially constant relative to a reference voltage received from outside the electronic device. A voltage pulse of the plurality of voltage pulses may be less than a preceding voltage pulse, a difference between successive voltage pulses may be about 0.15 volts, and/or the voltage pulses may be in the range of about negative 2 volts to about negative five volts.

The controller may be configured to apply the pass voltage to the control gate electrodes of the unselected memory cell transistors as a plurality of pulses with each pulse of the pass voltage having a magnitude that is substantially constant while applying the plurality of voltage pulses to the channel region, and the magnitude of each pulse of the pass voltages may be in the range of about 4 volts to about 5 volts. The controller may be configured to apply the pass voltage as increasing pass voltage pulses while applying successive voltage pulses to the channel region, a difference between successive pass voltage pulses may be about 0.15 volts, and/or the pass voltage pulses may be in the range of about 2 volts to about 5 volts.

Differences between magnitudes of the pass voltage and the program voltage may remain substantially constant while applying successive voltage pulses to the channel region. A first difference between magnitudes of the pass voltage and a first of the voltage pulses while applying the first of the voltage pulses to the channel region may be different than a second difference between magnitudes of the pass voltage and a second of the voltage pulses while applying the second of the voltage pulses to the channel region. The controller may be further configured to perform a verification operation after applying each of the plurality of voltage pulses to the channel region, and to terminate application of further voltage pulses to the channel region upon passing the program verification operation.

An interface may be electrically coupled to the controller, and the interface may provide a detachable electrical and mechanical coupling with microprocessor. A radio interface may be electrically coupled to the controller, and the radio interface may provide a wireless coupling with a microprocessor. A bus may be electrically coupled to the controller, and a microprocessor may be electrically coupled to the bus with the microprocessor being configured to provide data over the bus to the controller to be programmed in the memory cell array. A user interface may be electrically coupled to the bus, and the user interface may be configured to provide data to the microprocessor and to receive data from the microprocessor.

The memory cell array may include a plurality of wordlines with each of the wordlines coupled to a respective one of the memory cell transistors in the string. The controller may include a row decoder coupled to the wordlines and a page buffer coupled to the bitline. The controller may be configured to apply the program and pass voltages from the row decoder over respective wordlines and to apply the plurality of negative program voltage pulses from the page buffer over the bitline.

DETAILED DESCRIPTION

Figure 1:
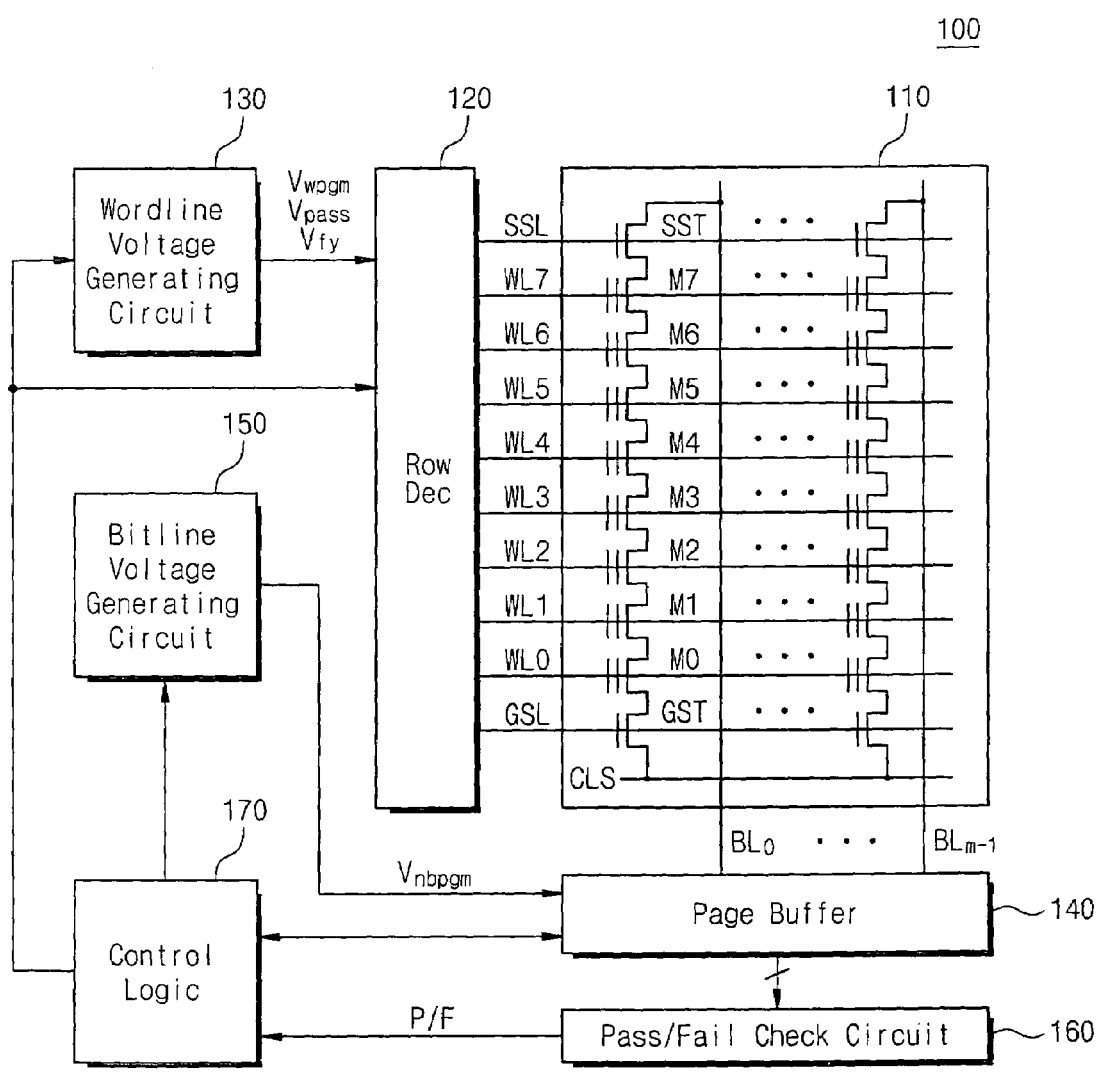
FIG. 1 is a block diagram illustrating a non-volatile memory device including multi-level cell (MLC) memory transistors (also referred to as memory cell transistors) according to embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIG. 1 is a block diagram illustrating a non-volatile memory device including multi-level cell (MLC) transistors according to embodiments of the present invention. As shown in FIG. 1, the non-volatile memory device may include a memory cell array 110, a row decoder 120, a wordline voltage generating circuit 130, a page buffer 140, a bitline voltage generating circuit 150, a pass/fail check circuit 160, and control logic 170. As used herein, the term controller, for example, may refer to control logic 170, or to control logic 170 in combination with one or more of row decoder 120, wordline voltage generating circuit 130, page buffer 140, bitline voltage generating circuit 150, and/or pass/fail check circuit 160.

Memory cell array 110 may include a plurality of strings of multi-level cell (MLC) memory transistors (also referred to as memory cell transistors), and each string may include a plurality of MLC memory transistors M0-M7 electrically coupled in series between a string selection transistor SST and a ground selection transistor GST. Each string selection transistor SST may be electrically coupled in series between a respective string and a respective bitline BL, and each ground selection transistor GST may be electrically coupled in series between a respective string and a common source line CSL. Moreover, bitlines BL0 to BLm−1 (where m is the number of columns in the memory cell array 110) may be electrically coupled between respective strings (in a same column) and page buffer 140; wordlines WL0 to WL7 may be electrically coupled between control electrodes of respective memory cell transistors (in a same row) and row decoder 120; string selection lines SSL may be electrically coupled between control gate electrodes of respective string selection transistors SST (in a same block) and row decoder 120; and ground selection lines GSL may be electrically coupled between control gate electrodes of respective gate selection transistors GST (in a same block) and row decoder 120. While eight memory cell transistors M0-M7 are shown in a string by way of example, embodiments of the present invention may include any number of memory transistors in a string. Moreover, page buffer operations for even and odd bitlines are discussed, for example, with respect to FIG. 7 of U.S. Pat. No. 6,522,580 to Chen et al., the disclosure of which is hereby incorporated herein in its entirety by reference.

While only one block of memory transistors is explicitly shown in the memory cell array 110 of FIG. 1 for ease of illustration, it will be understood that the memory cell array 110 may include multiple blocks of memory transistors arranged in respective strings and rows. More particularly, each block of memory transistors may include a plurality of strings of memory transistors with each string in a block coupled to respective ones of the bitlines BL0 to BLm−1. In other words, each of the bitlines BL0 to BLm−1 may be coupled to one string of memory transistors in each block. As noted above, a wordline is provided for each row of memory transistors in a block, and string and ground selection lines are provided for each block. Accordingly, respective string and ground selection lines and wordlines (electrically coupled to row decoder 120) may be provided for each block of memory transistors.

Figure 2:
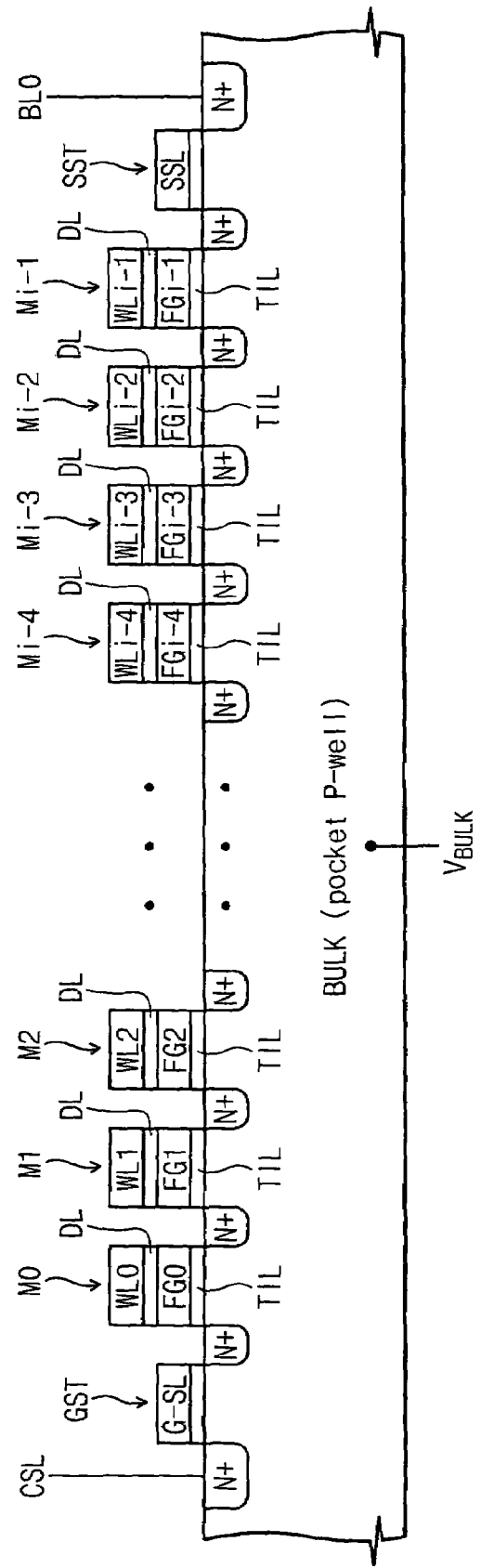
FIG. 2 is a cross sectional view illustrating a string of memory cell transistors M0 to Mi–1 according to embodiments of the present invention.

FIG. 2 is a cross sectional view illustrating a string of memory cell transistors M0 to Mi−1 according to embodiments of the present invention. As shown in FIG. 2, each memory cell transistor M may include a floating gate FG between a respective wordline WL (acting as a control gate CG, which may also be referred to as a control gate electrode or a control electrode) and a P-Well region of a semiconductor substrate. Each memory cell transistor M may also include n-type source/drain regions S/D (shown as n-type regions n+) on opposite sides of the floating gate FG. In addition, a tunnel insulating layer TIL may be provided between floating gate FG of each memory cell transistor M and the substrate, a dielectric layer DL may be provided between floating gate FG and word line WL (or control gate) of each memory cell transistor M, and each wordline WL may be electrically coupled to row decoder 120 and to other memory cell transistors in a same row. A memory cell transistor M may thus be programmed by charging the respective floating gate FG to change a threshold voltage of the memory cell transistor M. While a floating gate FG is discussed by way of example, any charge trapping layer or gate may be used. While the memory cell structures of FIG. 2 are discussed by way of example, negative incremental step pulse programming according to embodiments of the present invention may be implemented using other memory cell structures. Embodiments of the present invention may be implemented, for example, with charge trap memory cell strictures as discussed in U.S. Patent Publication No. 2006/0171209 entitled "Charge Trap Memory Cell With Multi-Doped Layers, Flash Memory Array Using The Memory Cell And Operating Method Of The Same" to Jae Sung Sim et al., the disclosure of which is hereby incorporated herein in its entirety by reference.

The string of memory cell transistors M0 to Mi−1 may be electrically coupled in series between respective ground select and string select transistors GST and SST. The ground select transistor GST (which may be a MOSFET) provides electrical coupling/decoupling between the string and a common source line GSL, and the string select transistor SST (which may be a MOSFET) provides electrical coupling/decoupling between the string and a respective bit line BLO. More particularly, a portion of a ground select line GSL coupled to the row decoder may act as a control electrode for the ground select transistor GST, and a portion of a string select line SSL coupled to the row decoder may act as a control electrode for the string select transistor SST.

The pocket P-well of FIG. 2 may be provided for a block of memory cell transistors (with a block including a plurality of strings sharing the same wordlines). Pocket P-wells of different blocks, however, may be electrically isolated from each other to allow selective erasing/programming of different blocks. More particularly, the pocket P-well of FIG. 2 may be provided in a larger n-type region of the substrate so that different pocket P-wells are separated by portions of the larger n-type region. Electrical isolation may thus be provided by the P-N junctions between the pocket P-wells and the larger N-type well. The larger N-type well may be provided by forming the memory device on an N-type substrate, and/or by forming a larger N-type well in the substrate (such as a P-type substrate) before forming the pocket P-well. Isolation of P-wells for non-volatile memory devices is discussed, for example, with respect to FIG. 3 of U.S. Pat. No. 6,522,580 to Chen et al., the disclosure of which is hereby incorporated herein in its entirety by reference.

Figure 3:
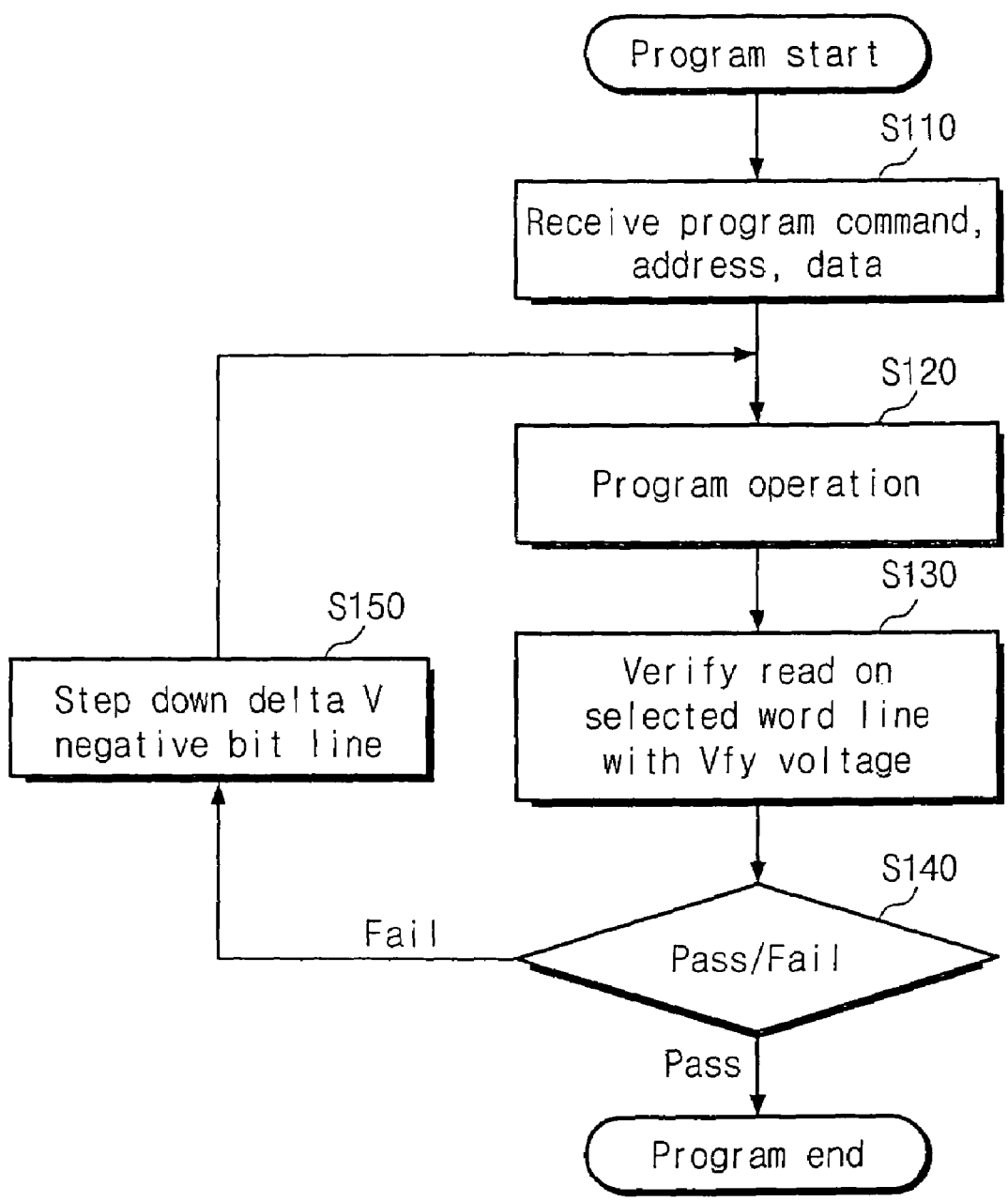
FIG. 3 is a flow chart illustrating operations of programming a memory cell transistor of a string according to embodiments of the present invention.

FIG. 3 is a flow chart illustrating operations of programming a selected memory cell transistor of a string (such as memory cell transistor M3 of FIG. 1) according to embodiments of the present invention. Before initiating a program operation, the memory cell transistor to be programmed may be erased. More particularly, a block of memory cell transistors including the selected memory cell transistor to be programmed may be erased. Once the selected memory cell transistor has been erased, program operations may be initiated by receiving a program command, an address identifying the selected memory cell transistor(s) to be programmed, and data to be programmed at control logic 170 as indicated at block S110. During a first program operation at block S120, a first negative program voltage pulse may be applied to a channel region of the selected memory cell transistor while applying a positive program voltage to a control gate of the selected memory cell transistor. At block S130, a verify read operation may be performed for the selected memory cell transistor using a verify voltage Vfy to determine if the selected memory cell transistor has been programmed to the desired threshold voltage corresponding to the data being programmed.

If the selected memory cell transistor has been programmed to the desired threshold voltage corresponding to the data being programmed at block S140 so that the verification passes, programming operations for the selected memory cell transistor may end. If the selected memory cell transistor has not yet been programmed to the desired threshold voltage corresponding to the data being programmed at block S140 so that the verification fails, programming operations for the selected memory cell transistor may continue until the verification passes. More particularly, a magnitude of a next negative program voltage pulse may be increased (i.e., made more negative) by a delta-V ($\Delta V$) at block S150 for a subsequent program operation at block S120.

Figure 4:
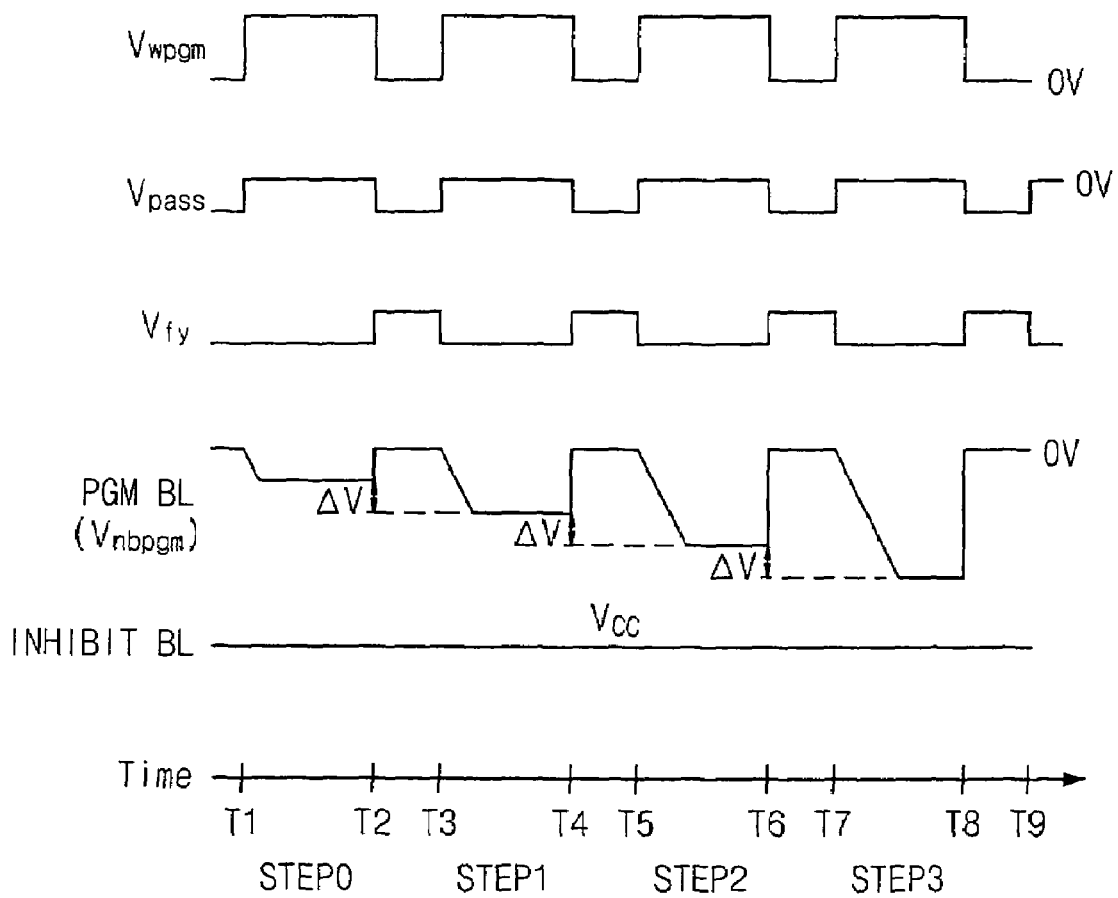
FIG. 4 is a timing diagram illustrating operations of programming a selected memory transistor according to embodiments of the present invention.

FIG. 4 is a timing diagram illustrating operations of programming a selected memory transistor according to embodiments of the present invention discussed above with respect to FIG. 3. As shown in FIG. 4, program operations of block S1120 may be iteratively performed between times T1 and T2, between times T3 and T4, between times T5 and T6, and between times T7 and T8. In contrast, verify read operations of block S130 may be performed between times T2 and T3, between times T4 and T5, between times T6 and T7, and between T8 and T9. Particular signals for program operations according to embodiments of the present invention are discussed in greater detail below. Further discussion of particular signals for verify read operations will be omitted because particular signals used for verify read operations will be known to those having skill in the art.

Figures 5A, 5B:
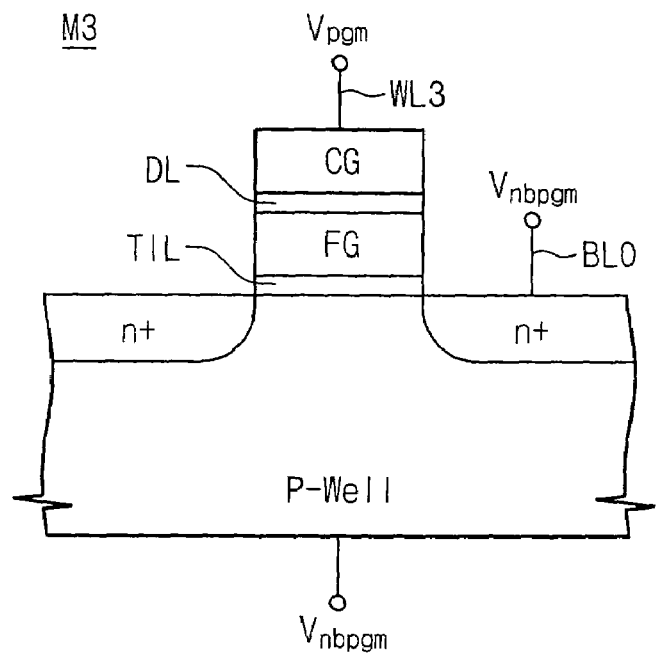
FIG. 5A is a cross sectional view illustrating a selected memory cell transistor being programmed during a current program operation.
FIG. 5B is a table of signals applied to the selected memory cell transistor during the current program operation, according to embodiments of the present invention.
Figures 6A, 6B:
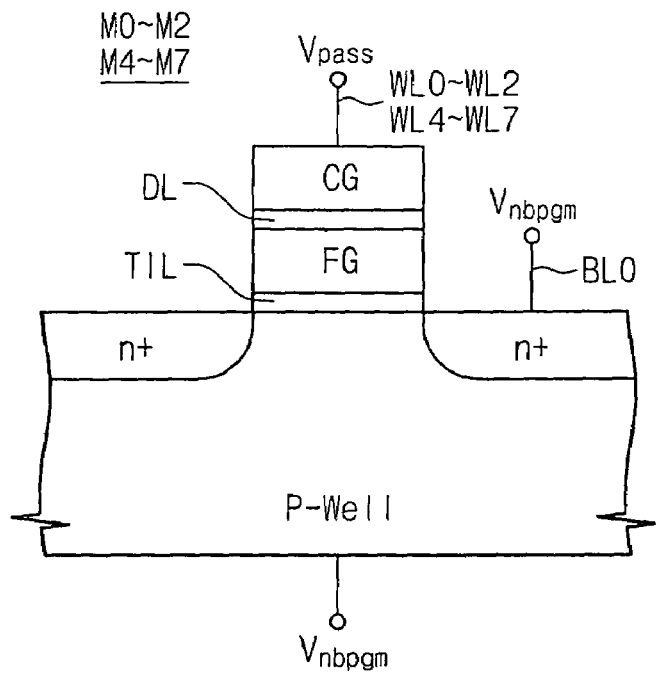
FIG. 6A is a cross sectional view illustrating a representative unselected memory cell transistor not being programmed during a current program operation.
FIG. 6B is a table of signals applied to the unselected memory cell transistor during the current program operation according to embodiments of the present invention.

By way of example, the memory cell transistor M3 of FIG. 1 may be selected for a program operation based on an address received by the control logic 170 at block S110 of FIG. 3. Moreover, data received at block S110 may define a value to which the selected memory cell transistor M3 is to be programmed. FIG. 5A is a cross sectional view illustrating the selected memory cell transistor M3 being programmed during a current program operation, and FIG. 5B is a table of signals applied to the selected memory cell transistor M3 during the current program operation. FIG. 6A is a cross sectional view illustrating a representative unselected memory cell M0-M2 and/or M4-M7 not being programmed during the current program operation, and FIG. 6B is a table of signals applied to an unselected memory cell transistor M0-M2 and/or M4-M7 during the current program operation.

In the example of FIGS. 4, 5A-5B, and 6A-6B, all voltages are expressed relative to a reference voltage (e.g., a ground voltage) received from outside the memory device 100. A magnitude of pass voltage Vpass, for example, may be in the range of about 2 volts to about 5 volts relative to a ground voltage, and according to some embodiments of the present invention, a magnitude of the pass voltage Vpass may be about 4.5 volts relative to the ground voltage. A magnitude(s) of the negative bitline program voltage Vnbpgm may be in the range of about −2 volts to about −5 volts relative to the ground voltage.

During an initial program operation STEP0 between times T1 and T2 at block S120, a negative bitline program voltage Vnbpgm pulse of about −4.7 volts may be applied (from control logic 170, bitline voltage generating circuit 150, and page buffer 140) to the selected bit line BL0 while applying a program voltage Vpgm of about 10 volts (from control logic 170, wordline voltage generating circuit 130, and row decoder 120) to the selected wordline WL3 and while applying a pass voltage Vpass (from control logic 170, wordline voltage generating circuit 130, and row decoder 120) to the unselected wordlines WL0-WL2 and WL4-WL7. The negative bitline program voltage Vnbpgm may also be applied to the p-well bulk region on which the block of memory cell transistors are formed, and an inhibit voltage (e.g., a power supply voltage Vcc of the memory device) may be applied (from control logic 170, bitline voltage generating circuit 150, and page buffer 140) to unselected bit lines BL1-BLm−1. Moreover, a turn on signal (such as Vpass) may be applied to the string selection line SSL of the selected block to couple the strings of the selected block to the respective bitlines, and a turn-off signal (such as reference ground) may be applied to the ground selection line GSL of the selected block to electrically isolate the strings of the selected block from the common source line CSL.

By applying the negative bitline program voltage Vnbpgm to the p-well bulk region and to the selected bit line BL0, P-N junctions between the p-well bulk region and the source/drain regions may be protected from turning on. A voltage potential between the control gate CG of the selected memory cell transistor M3 and a channel region of the selected memory cell transistor M3 may thus be about 14.7 volts, and electron tunneling from the channel region through the tunnel insulating layer TIL to the floating gate FG may provide charging of the floating gate FG of the selected memory cell transistor M3 during the initial program operation STEP0 between times T1 and T2.

During an initial program verify operation between times T2 and T3 at block S130, a read verify operation may be performed using control logic 170, bitline voltage generating circuit 150, wordline voltage generating circuit 130, row decoder 120, page buffer 140, and pass/fail check circuit 160 to determine if programming of the selected memory cell transistor M3 has been completed. If programming of the selected memory cell transistor M3 is determined to be complete at block S140, the programming operation may end. If programming of the selected memory cell transistor M3 is determined to be incomplete at block S140, a magnitude of the negative bitline line program voltage Vnbpgm may be increased at block S150 for a subsequent program operation at block S120.

During a subsequent program operation STEP1 between times T3 and T4 at block S120, a negative bitline program voltage Vnbpgm pulse of about −4.85 volts may be applied (from control logic 170, bitline voltage generating circuit 150, and page buffer 140) to the selected bit line BL0 while applying a program voltage Vpgm of about 10 volts (from control logic 170, wordline voltage generating circuit 130, and row decoder 120) to the selected wordline WL3 and while applying a pass voltage Vpass of about 4.5 volts (from control logic 170, wordline voltage generating circuit 130, and row decoder 120) to the unselected wordlines WL0-WL2 and WL4-WL7. The negative bitline program voltage Vnbpgm of about −4.85 volts may also be applied to the p-well bulk region on which the block of memory cell transistors are formed, and an inhibit voltage (e.g., a power supply voltage Vcc of the memory device) may be applied (from control logic 170, bitline voltage generating circuit 150, and page buffer 140) to unselected bit lines BL1-BLm−1. Moreover, a turn on signal (such as Vpass) may be applied to the string selection line SSL of the selected block to couple the strings of the selected block to the respective bitlines, and a turn-off signal (such as reference ground) may be applied to the ground selection line GSL of the selected block to electrically isolate the strings of the selected block from the common source line CSL.

By applying the same negative bitline program voltage Vnbpgm to the p-well bulk region and to the selected bit line BL0, P-N junctions between the p-well bulk region and the source/drain regions may be protected from turning on. A voltage potential between the control gate CG of the selected memory cell transistor M3 and a channel region of the selected memory cell transistor M3 may thus be about 14.85 volts, and electron tunneling from the channel region through the tunnel insulating layer TIL to the floating gate FG may provide further charging of the floating gate FG of the selected memory cell transistor M3 during the program operation STEP1 between times T3 and T4.

During a program verify operation between times T4 and T5 at block S130, a read verify operation may be performed using control logic 170, bitline voltage generating circuit 150, wordline voltage generating circuit 130, row decoder 120, page buffer 140, and pass/fail check circuit 160 to determine if programming of the selected memory cell transistor M3 has been completed. If programming of the selected memory cell transistor M3 is determined to be complete at block S140, the programming operation may end. If programming of the selected memory cell transistor M3 is determined to be incomplete at block S140, a magnitude of the negative bitline line program voltage Vnbpgm may be further increased at block S150 for another subsequent program operation at block S120.

During another subsequent program operation STEP2 between times T5 and T6 at block S120, a negative bitline program voltage Vnbpgm pulse of about −5.00 volts may be applied (from control logic 170, bitline voltage generating circuit 150, and page buffer 140) to the selected bit line BL0 while applying a program voltage Vpgm of about 10 volts (from control logic 170, wordline voltage generating circuit 130, and row decoder 120) to the selected wordline WL3 and while applying a pass voltage Vpass of about 4.5 volts (from control logic 170, wordline voltage generating circuit 130, and row decoder 120) to the unselected wordlines WL0-WL2 and WL4-WL7. The negative bitline program voltage Vnbpgm of about −5.00 volts may also be applied to the p-well bulk region on which the block of memory cell transistors are formed, and an inhibit voltage (e.g., a power supply voltage Vcc of the memory device) may be applied (from control logic 170, bitline voltage generating circuit 150, and page buffer 140) to unselected bit lines BL1-BLm−1. Moreover, a turn on signal (such as Vpass) may be applied to the string selection line SSL of the selected block to couple the strings of the selected block to the respective bitlines, and a turn-off signal (such as reference ground) may be applied to the ground selection line GSL of the selected block to electrically isolate the strings of the selected block from the common source line CSL.

By applying the same negative bitline program voltage Vnbpgm to the p-well bulk region and to the selected bit line BL0, P-N junctions between the p-well bulk region and the source/drain regions may be protected from turning on. A voltage potential between the control gate CG of the selected memory cell transistor M3 and a channel region of the selected memory cell transistor M3 may thus be about 15 volts, and electron tunneling from the channel region through the tunnel insulating layer TIL to the floating gate FG may provide further charging of the floating gate FG of the selected memory cell transistor M3 during the program operation STEP2 between times T5 and T6.

During a program verify operation between times T6 and T7 at block S130, a read verify operation may be performed using control logic 170, bitline voltage generating circuit 150, wordline voltage generating circuit 130, row decoder 120, page buffer 140, and pass/fail check circuit 160 to determine if programming of the selected memory cell transistor M3 has been completed. If programming of the selected memory cell transistor M3 is determined to be complete at block S140, the programming operation may end. If programming of the selected memory cell transistor M3 is determined to be incomplete at block S140, a magnitude of the negative bitline line program voltage Vnbpgm may be further increased at block S150 for yet another subsequent program operation at block S120.

During yet another subsequent program operation STEP3 between times T7 and T8 at block S120, a negative bitline program voltage Vnbpgm pulse of about −5.15 volts may be applied (from control logic 170, bitline voltage generating circuit 150, and page buffer 140) to the selected bit line BL0 while applying a program voltage Vpgm of about 10 volts (from control logic 170, wordline voltage generating circuit 130, and row decoder 120) to the selected wordline WL3 and while applying a pass voltage Vpass of about 4.5 volts (from control logic 170, wordline voltage generating circuit 130, and row decoder 120) to the unselected wordlines WL0-WL2 and WL4-WL7. The negative bitline program voltage Vnbpgm of about −5.15 volts may also be applied to the p-well bulk region on which the block of memory cell transistors are formed, and an inhibit voltage (e.g., a power supply voltage Vcc of the memory device) may be applied (from control logic 170, bitline voltage generating circuit 150, and page buffer 140) to unselected bit lines BL1-BLm−1. Moreover, a turn on signal (such as Vpass) may be applied to the string selection line SSL of the selected block to couple the strings of the selected block to the respective bitlines, and a turn-off signal (such as reference ground) may be applied to the ground selection line GSL of the selected block to electrically isolate the strings of the selected block from the common source line CSL.

By applying the same negative bitline program voltage Vnbpgm to the p-well bulk region and to the selected bit line BL0, P-N junctions between the p-well bulk region and the source/drain regions may be protected from turning on. A voltage potential between the control gate CG of the selected memory cell transistor M3 and a channel region of the selected memory cell transistor M3 may thus be about 15 volts, and electron tunneling from the channel region through the tunnel insulating layer TIL to the floating gate FG may provide further charging of the floating gate FG of the selected memory cell transistor M3 during the program operation STEP3 between times T7 and T8.

During a program verify operation between times T8 and T9 at block S130, a read verify operation may be performed using control logic 170, bitline voltage generating circuit 150, wordline voltage generating circuit 130, row decoder 120, page buffer 140, and pass/fail check circuit 160 to determine if programming of the selected memory cell transistor M3 has been completed. If programming of the selected memory cell transistor M3 is determined to be complete at block S140, the programming operation may end. If programming of the selected memory cell transistor M3 is determined to be incomplete at block S140, a magnitude of the negative bitline line program voltage Vnbpgm may be further increased at block S150 for a further program operation(s) at block S120. Any number of further iterations of program operations may be performed until the read verify operation passes at blocks S130 and S140 or until a program operation limit is reached.

According to embodiments discussed above, a delta-V (ΔV) of 0.15 volts may be provided for each successive program operation, and a same delta-V may be used for each step down at block S150. Other values of delta-V, however, may be used, and/or different values of delta-V may be used for different iterations of program operation S120 when programming a same memory cell transistor. According to still other embodiments of the present invention, some or all successive iterations of program operation S120 may use a same negative bitline program voltage Vnbpgm when programming a memory cell transistor, and/or a magnitude of the negative bitline program voltage Vnbpgm may be reduced from one iteration of program operation S120 to a next program operation S120. Moreover, the negative bitline program voltage Vnbpgm may be negative relative to a reference voltage (e.g., a ground voltage) received from outside the memory device, and the negative bitline program voltage Vnbpgm during at least some iterations of the program operation S120 may be in the range of about negative 2 volts to about negative 5 volts.

The program voltage Vpgm may be applied to the selected wordline as a pulse during each iteration of the program operation S120 with a magnitude that is substantially constant relative to a reference voltage (e.g., a ground voltage) received from outside the memory device, and the program voltage Vpgm may be positive relative to the reference voltage (e.g., the ground voltage). Accordingly, the negative bitline program voltage Vnbpgm may be negative relative to the reference voltage (e.g. the ground voltage).

The negative bitline program voltage Vnbpgm may be applied to the selected memory cell transistor during program operations through the respective bitline by turning the string selection transistor SST on (i.e., by applying a turn-on signal to the string selection line SSL). According to other embodiments of the present invention, the string selection transistor SST may be turned off during program operations with the negative bitline program voltage Vnbpgm being applied to the p-well bulk. According to some other embodiments of the present invention, the negative bitline program voltage Vnbpgm may be applied during program operations to the selected memory cell transistor both through the respective bitline and string selection transistor and through the p-well bulk.

As discussed above with respect to FIGS. 3, 4, 5A, and 5B, a selected memory cell transistor M3 may be programmed using negative bitline program voltage(s) Vnbpgm. In addition, another memory cell transistor sharing the wordline WL3 (i.e., in a same row) with memory cell transistor M3 may be programmed simultaneously. More particularly, operations of blocks S120, S130, S140, and S150 may be iteratively performed simultaneously for the two memory cell transistors sharing the same wordline. Moreover, the read verify operations of blocks S130 and S140 may be independently performed at the same time for the two different memory cell transistors. If programming for one of the two memory cell transistors is completed before the other, programming iterations for the programmed memory cell transistor may be terminated (by applying the inhibit bitline signal to the respective bitline) while programming iterations for the other memory cell transistor may continue. A number of programming iterations used to program two different memory cell transistors sharing a same wordline may differ, for example, because the memory cell transistors are being programmed to different values and/or because the respective floating gates charge at different rates. As discussed above, programming of memory cell transistors sharing a same wordline with a selected memory cell transistor (i.e., selected for programming) may be inhibited by applying a program inhibit voltage (such as a power supply voltage) to bitlines corresponding to the unselected memory cell transistors.

As discussed above with respect to FIGS. 4, 5A-5B, and 6A-6B, a constant program voltage Vpgm may be applied to the selected word line during successive iterations of the program operation S120 while a magnitude of the negative bitline program voltage Vnbpgm is increased (i.e., made more negative) with successive iterations of the program operation S120. According to some other embodiments of the present invention, a constant negative bit line program voltage Vnbpgm may be applied to the selected bit line and/or p-well bulk during successive iterations of the program operation S120 while a magnitude of the program voltage Vpgm is increased (i.e., made more positive) with successive iterations of the program operation S120.

Figure 7:
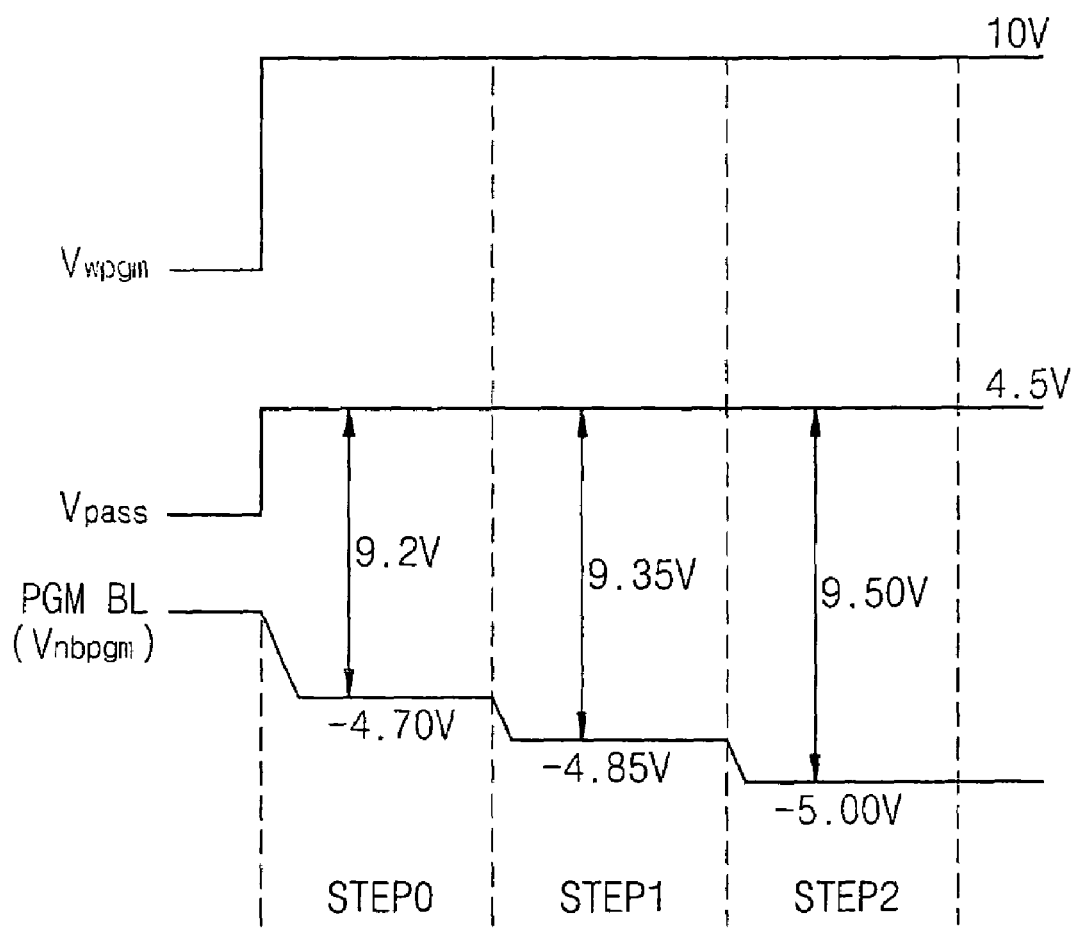
FIG. 7 is a signal diagram illustrating iterations STEP0, STEP1, and STEP2 of program operations S120 according to some embodiments of the present invention.

FIG. 7 is a signal diagram illustrating iterations STEP0, STEP1, and STEP2 of program operations S120 according to some embodiments of the present invention, with illustration of intervening verify operations omitted. By omitting illustration of the intervening verify operations, iterations of program operations may be more easily illustrated. A difference between the pass voltage Vpass applied to unselected wordlines and the negative bitline program voltage Vnbpgm applied to channel regions of the unselected memory cell transistors may result in stress on unselected wordlines. As shown in FIG. 7, a 9.2 volt stress may be applied to unselected wordlines during program operation iteration STEP0, a 9.35 volt stress may be applied to unselected wordlines during program operation iteration STEP1, and a 9.5 volt stress may be applied to unselected wordlines during program operation iteration STEP2. Additional iterations of program operations may be provided when programming a memory cell, and/or an arbitrary limit may be placed on a number of iterations that may be allowed when programming a memory cell. By incrementally reducing the negative bitline program voltage Vnbpgm (i.e., incrementally increasing a magnitude of the negative bitline program voltage) during successive program operations, wordline stress for unselected wordlines may be reduced (at least during initial program operation iterations).

Figure 8:
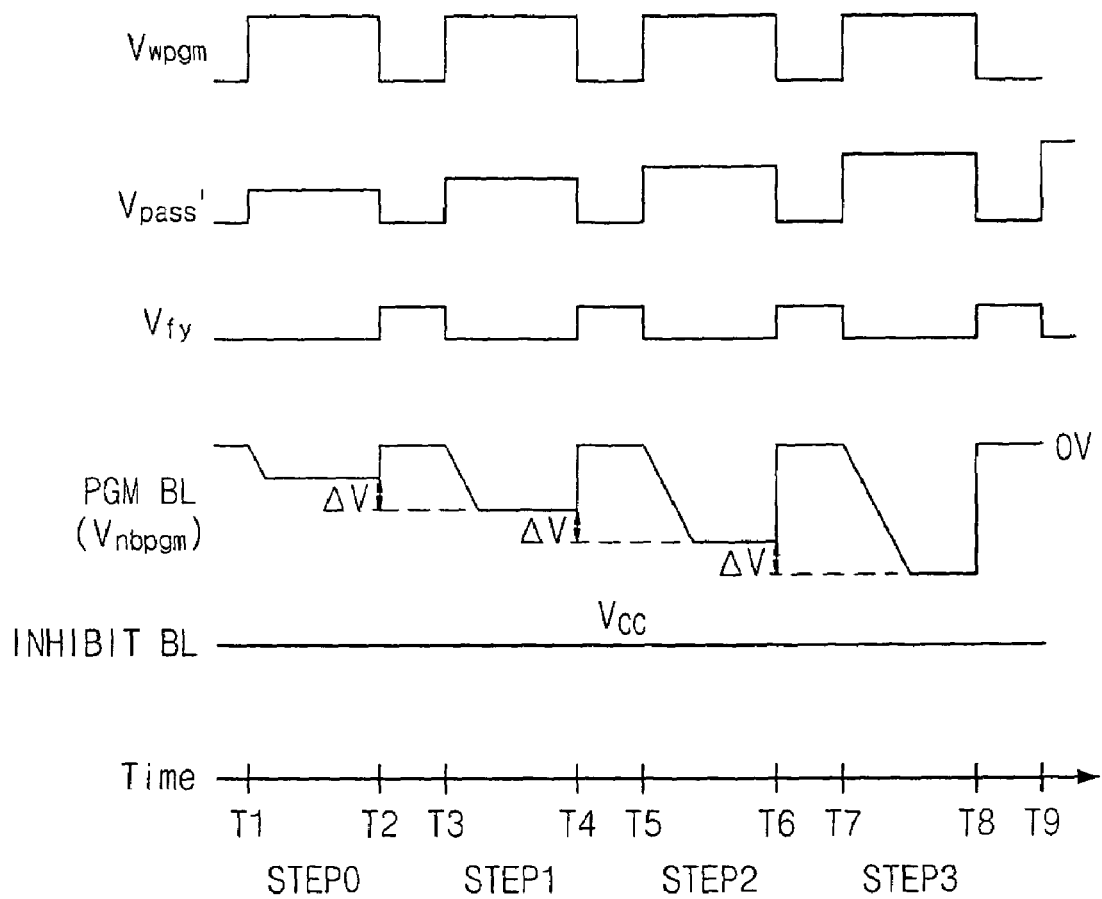
FIG. 8 is a timing diagram illustrating operations of programming a selected memory transistor according to additional embodiments of the present invention.

FIG. 8 is a timing diagram illustrating operations of programming a selected memory transistor according to additional embodiments of the present invention discussed above with respect to FIG. 3. In FIG. 8, the negative bitline program voltage Vnbpgm, the read verify signal Vfy, the wordline program voltage Vwpgm, and the inhibit bitline INHIBIT BL signal may be the same as discussed above with respect to FIGS. 3-7. In FIG. 8, however, the pass voltage Vpass' may be applied to the control gate electrodes of unselected memory cell transistors as increasing positive pass voltage pulses while applying successive negative voltage pulses to the channel region. Stated in other words, a magnitude of the pass voltage Vpass' may increase with each iteration of program operation S120 (i.e., STEP0, STEP 1, STEP2, STEP3, etc.). More particularly, the pass voltage pulses Vpass' may be in the range of about 2 volts to about 5 volts, and/or successive pass voltage pulses may increase by about 0.15 volts. By using relatively low voltage pulses Vpass' during initial program operations S120 used to program a memory cell, wordline stress on unselected wordlines may be further reduced.

Embodiments of the present invention may provide single pass programming as discussed above with respect to FIGS. 3-8. According to other embodiments of the present invention, multi-pass programming may be used. For example, a first pass of programming, also referred to as coarse programming, may be provided with an initial negative programming voltage Vnbpgm having a first relatively low magnitude followed by subsequent negative programming voltages Vnbpgm having increasing magnitudes. A second pass of programming (after the first pass for the same programming operation), also referred to as fine programming, may be provided with an initial negative programming voltage Vnbpgm having a second relatively low magnitude (greater than the first relatively low magnitude) followed by subsequent negative programming voltages Vnbpgm having increasing magnitudes.

Figure 9:
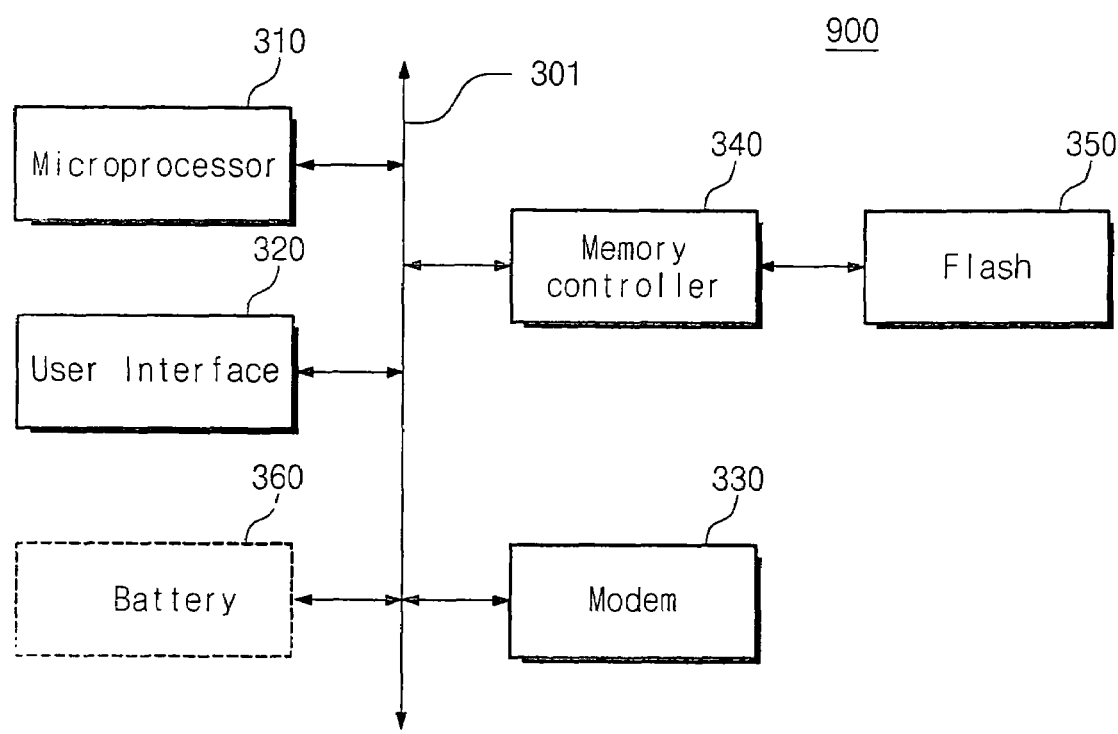

FIG. 9 is a block diagram of a portable and/or wireless electronic device 900 including nonvolatile flash memory according to embodiments of the present invention. The electronic device 900, for example, may include a microprocessor 310, a user interface 320, a battery 360, and/or a modem 330 coupled over a bus 301. In addition, a nonvolatile flash memory device 350 may be coupled to the bus 301. More particularly, the nonvolatile flash memory device 350 may be implemented according to embodiments of the present invention as discussed above with respect to FIGS. 1-8. The memory controller 340 may provide an interface between the flash memory device 350 and the bus 301. More particularly the memory controller 340 may provide an interface between the bus 301 of FIG. 9 and control logic 170 of FIG. 1, and/or the memory controller 340 may be implemented as a portion of control logic 170.

The electronic device 900 may be a hand held or laptop computer, a personal digital assistant, a digital audio/video player/recorder, a radiotelephone (with inclusion of a transceiver), a positioning/mapping device (with inclusion of a positioning receiver, such as a GPS receiver), a digital camera, a game console, a router, etc. Moreover, the nonvolatile flash memory device 350 may be permanently installed in the electronic device 900, or the nonvolatile flash memory device 350 may be detachably coupled to the bus 301 so that the memory device 350 may be inserted into and removed from the electronic device 900. The nonvolatile flash memory device 350 and the controller 340, for example, may be implemented as a memory card, such as a MMC (MultiMediaCard) card, an SD (Secure Digital) card, a multiuse card, a micro SD (Secure Digital) card, a mini SD (Secure Digital) card, a memory stick, a compact SD (Secure Digital) card, an identification card, a PCMCIA (Personal Computer Memory Card International Association) card, an SSD (Solid State Drive) card, a chipcard, a smartcard, a USB (Universal Serial Bus) card, etc.

Figure 10:
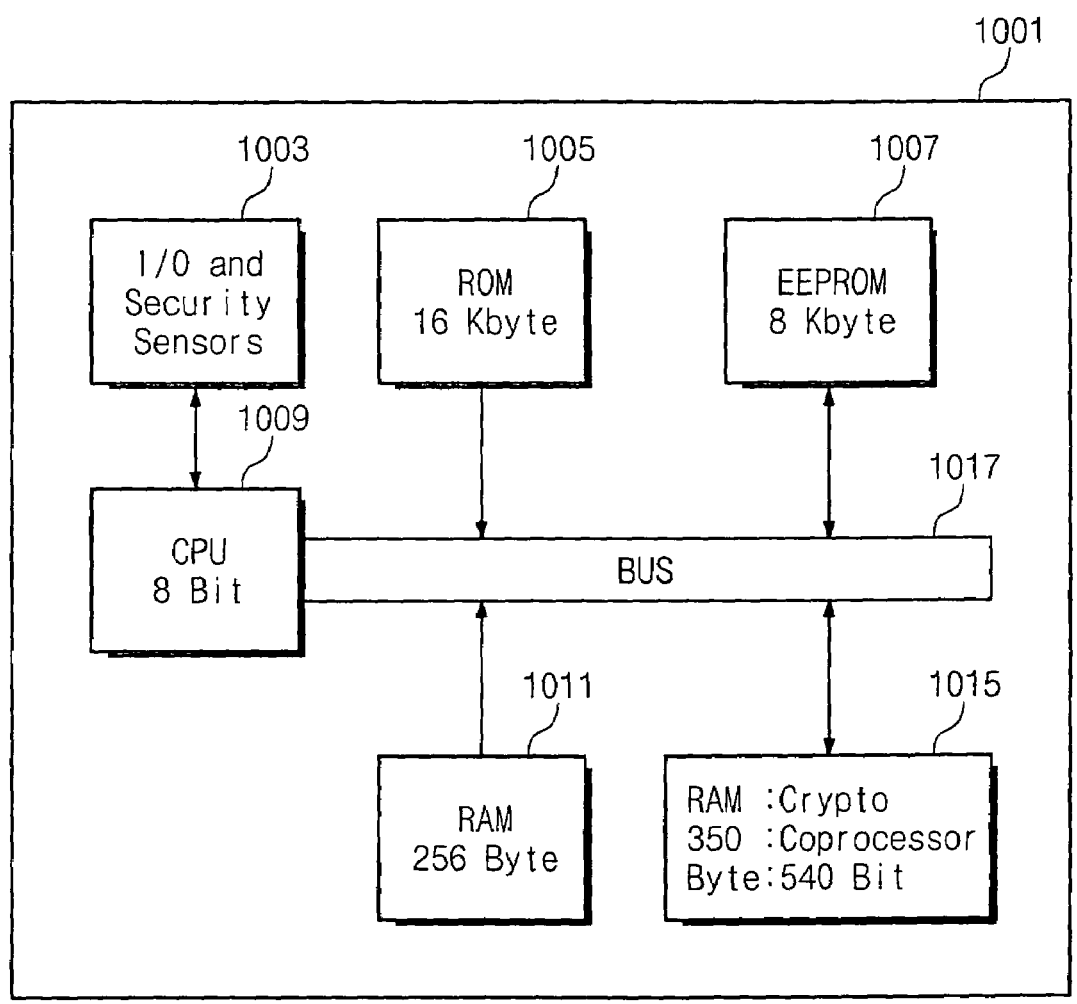
FIG. 10 is a block diagram of a contact type smartcard, also referred to as an Integrated Circuit Card (IIC), according to some embodiments of the present invention.

FIG. 10 is a block diagram of a contact type smartcard 1001, also referred to as an Integrated Circuit Card (IIC). The smartcard 1001, for example, may be a Subscriber Identity Module (SIM) card for wireless communications applications. More particularly, the smartcard 1001 may include an I/O (input/output) and Security Sensor block 1003, Read Only Memory (ROM) 1005, nonvolatile memory 1007 such as an Electrically Erasable Programmable Read Only Memory (EEPROM), central processing unit 1009, Random Access Memory (RAM) 1011, and a Crypto Coprocessor 1015 including additional RAM, all coupled through bus 1017. Moreover, the I/O and Security Sensor block 1003 may include a bank on input/output contacts with a power (VCC) contact, a ground (GND) contact, a reset (RST) contact, a programming voltage (VPP) contact, a clock (CLK) contact, and a data input/output contact. In addition, one or more unused contacts may be reserved for future use.

The smartcard 1001 of FIG. 10, for example, may be implemented as a SIM smartcard storing information used to identify a subscriber's cellular telephone (or other wireless communications device) to a communications service provider. By using I/O contacts, stable contact between the smartcard 1001 and the communications device may be provided. Moreover, effects of contact wear/damage may not be significant when used as a SIM smartcard for a communications device because such a SIM smartcard is not frequently moved from one communications device to another. In addition, the non-volatile memory 1007 of FIG. 10 may be implemented according to embodiments of the present invention as discussed above with respect to FIGS. 1-8.

Figure 11:
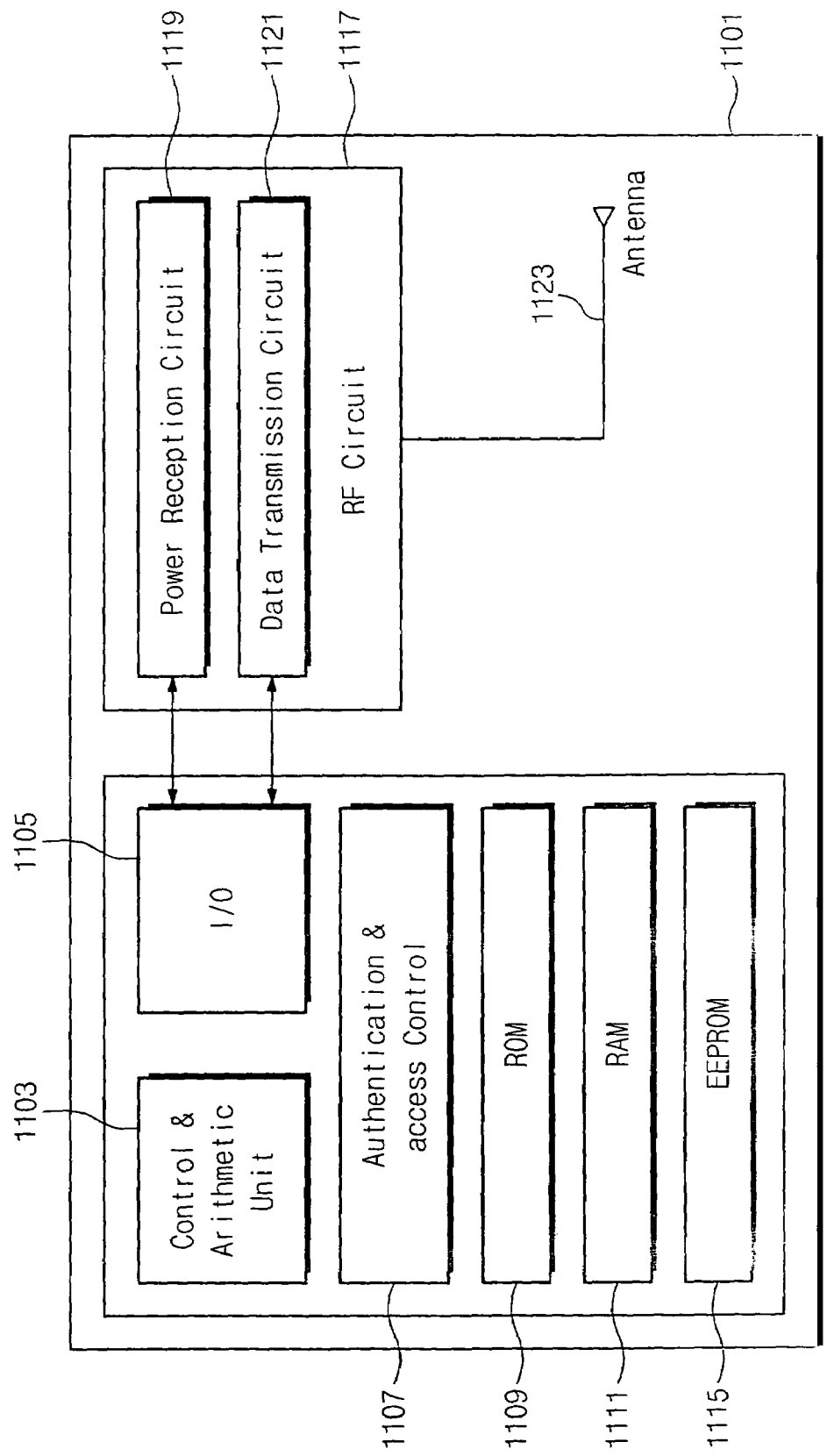
FIG. 11 is a block diagram of a wireless type smart card (or IIC) according to some embodiments of the present invention.

FIG. 11 is a block diagram of a wireless type smartcard 1101 (or IIC). The smartcard 1101 may include control & arithmetic unit 1103, input/output (I/O) block 1105, authentication and control block 1107, read only memory (ROM) 1109, random access memory (RAM) 1111, non-volatile memory 1115, and radio frequency circuit 1117 coupled to I/O block 1105. More particularly, the radio frequency circuit 1117 may include a power reception circuit 1119 and a data transmission circuit 1121 coupled to antenna 1123. By providing a wireless coupling to a system(s) outside the smartcard 1101, frequent coupling/decoupling with the same or different systems may not reduce performance due to contact wear. In addition, the non-volatile memory 1115 of FIG. 11 may be implemented according to embodiments of the present invention as discussed above with respect to FIGS. 1-8.

Figure 12:
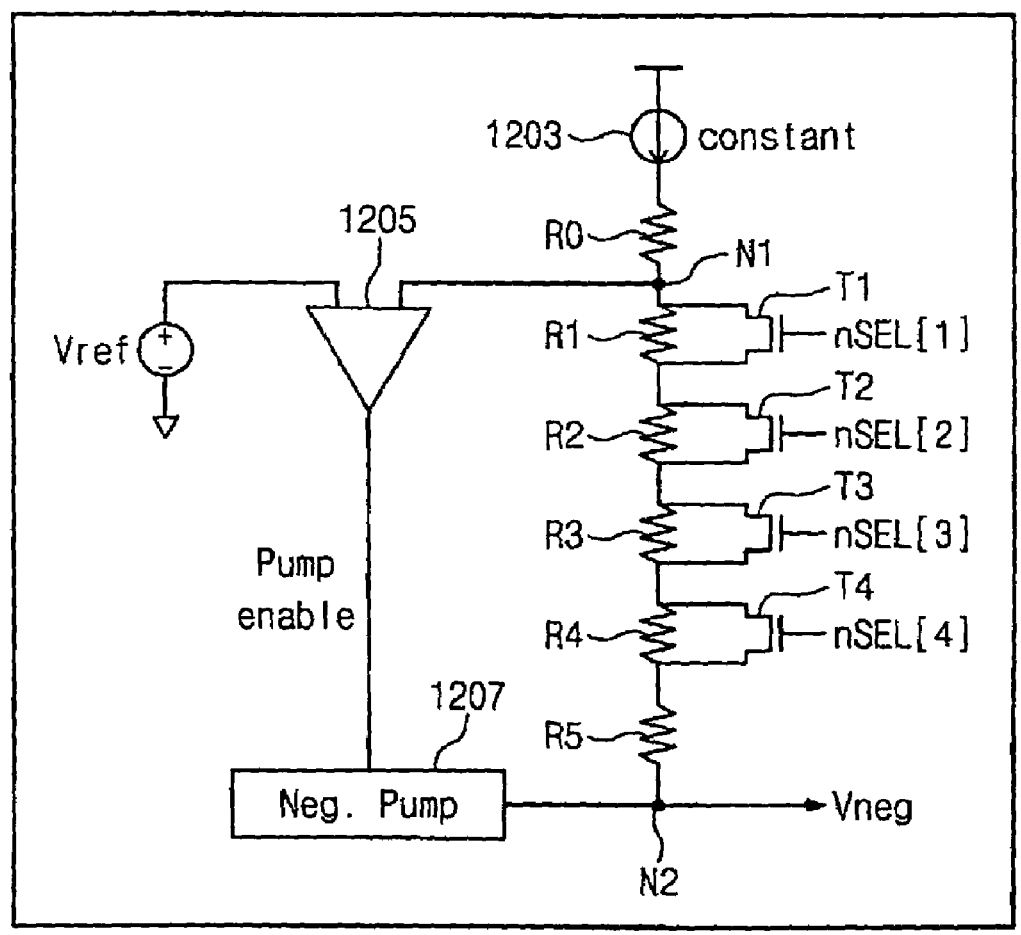
FIG. 12 is a schematic diagram of a bitline voltage generating circuit according to some embodiments of the present invention.

FIG. 12 is a schematic diagram of a bitline voltage generating circuit 1201 according to some embodiments of the present invention. More particularly, the bitline voltage generating circuit 1201 of FIG. 12 is an example of a circuit that may be used to implement the bitline voltage generating circuit 150 of FIG. 1. As shown in FIG. 12, the circuit 1201 may include a constant current source 1203, a plurality of resistors R0-R5 connected in series to provide a voltage divider, a plurality of bypass transistors T1-T4, a comparator 1205, and a negative voltage pump 1207. The comparator 1205 may compare a reference voltage Vref with a voltage at a node N1 (between resistors R0 and R1), and the pump enable output signal may be used to turn the negative voltage pump 1207 on and off to maintain the reference voltage Vref at the node N1. The bypass transistors T1-T4 may be selectively turned on/off using selection signals nSEL[1]-nSEL[4] to vary a number of the resistors R1-R4 that are effectively coupled in series between the node N1 and the output node N2. For example, a least negative output Vneg (or Vnbpgm) may be provided by turning all of the bypass transistors T1-T4 on, and a most negative output Vneg (or Vnbpgm) may be provided by turning all of the bypass transistors T1-T4 off.

Figure 13:
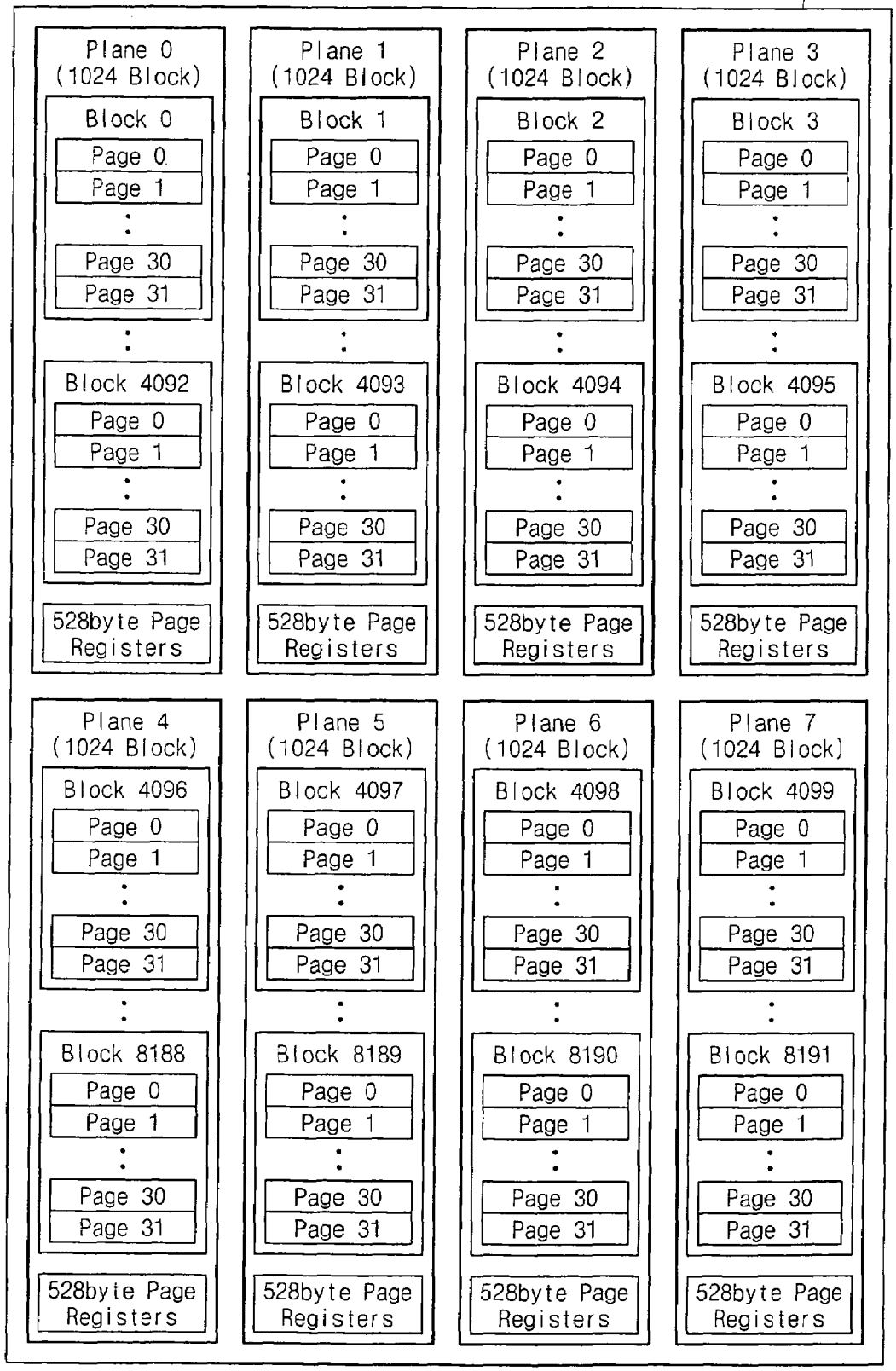
FIG. 13 is a memory array map illustrating an arrangement of memory elements that may be provided for the non-volatile memory device of FIG. 1 according to some embodiments of the present invention.

FIG. 13 is a memory array map illustrating an arrangement of memory elements that may be provided for the non-volatile memory device of FIG. 1 according to some embodiments of the present invention. As discussed above, the memory cell array 110 of FIG. 1 may include multiple blocks of memory cell transistors. As shown in FIG. 13, memory cell array 110 may be arranged, for example, in eight 128 Mbit planes. Each plane may include 1,024 blocks and 528 page registers. This arrangement may allow the memory device to perform simultaneous page program and block erase by selecting one page or block from each plane. The block address map may be configured so that multi-plane program/erase operations can be executed for every four sequential blocks by dividing the memory array into plane 0-3 or plane 4-7 separately. For example, multi-plane program/erase operations into plane 2, 3, 4, and 5 may be prohibited. With the memory arrangement by planes, a separate bitline voltage generating circuit 150 may be provided for each plane.

While the present invention has been particularly shown and described with reference to embodiments thereof, it will be understood by those of ordinary skill in the art that various changes in form and details may be made therein without departing from the spirit and scope of the present invention as defined by the following claims.

The invention claimed is:

1. A method of operating a memory device including a plurality of memory cell transistors serially coupled in a string between a string selection transistor and a ground selection transistor wherein the string selection transistor is coupled between the string and a bitline and wherein the ground selection transistor is coupled between the string and a common source line, the method comprising:

selecting one of the plurality of memory cell transistors in the string as a selected memory cell transistor for a program operation so that other memory cell transistors in the string are unselected;

during the program operation, applying a plurality of negative voltage pulses to a channel region of the selected memory cell transistor;

while applying the plurality of negative voltage pulses to the channel region, applying a positive pass voltage to control gate electrodes of the unselected memory cell transistors; and while applying the plurality of negative voltage pulses to the channel region, applying a positive program voltage to a control gate electrode of the selected memory cell.

2. A method according to claim 1 wherein applying the plurality of negative voltage pulses to the channel region of the selected memory cell transistor comprises applying the plurality of negative voltage pulses through the bitline.

3. A method according to claim 1 wherein the memory cells, the string selection transistor, and the ground selection transistor are provided on a well region, and wherein applying the plurality of negative voltage pulses to the channel region of the selected memory cell transistor comprises applying the plurality of negative voltage pulses through the well region while the string selection transistor is turned off.

4. A method according to claim 1 wherein the memory device further includes a second plurality of memory cell transistors serially coupled in a second string between a second string selection transistor and a second ground selection transistor wherein the second string selection transistor is coupled between the second string and a second bitline and wherein the second ground selection transistor is coupled between the second string and the common source line, the method further comprising:

selecting one of the second plurality of memory cell transistors in the second string as a second selected memory cell transistor for the program operation so that other memory cell transistors in the second string are unselected wherein control gate electrodes of the first and second selected memory cell transistors are electrically connected through a shared wordline;

during the program operation, applying the plurality of negative voltage pulses to channel regions of the first and second selected memory cell transistors;

while applying the plurality of negative voltage pulses to the channel regions, applying the positive pass voltage to control gate electrodes of the unselected memory cell transistors of the first and second strings; and while applying the plurality of negative voltage pulses to the channel regions, applying the positive program voltage through the shared wordline to control gate electrodes of the first and second selected memory cell transistors.

5. A method according to claim 1 wherein the memory device further includes a second plurality of memory cell transistors serially coupled in a second string between a second string selection transistor and a second ground selection transistor wherein the second string selection transistor is coupled between the second string and a second bitline and wherein the second ground selection transistor is coupled between the second string and the common source line, the method further comprising:

selecting one of the second plurality of memory cell transistors in the second string as a second selected memory cell transistor for the program operation so that other memory cell transistors in the second string are unselected wherein control gate electrodes of the first and second selected memory cell transistors are electrically connected through a shared wordline;

during the program operation while applying the plurality of negative voltage pulses to the channel region of the first selected memory cell transistor, applying a program inhibit voltage to the channel region of the second selected memory cell transistor;

while applying the plurality of negative voltage pulses to the channel region of the first selected memory cell transistor, applying the positive pass voltage to control gate electrodes of the unselected memory cell transistors of the first and second strings; and while applying the plurality of negative voltage pulses to the channel region of the first selected memory cell transistor, applying a positive program voltage through the shared wordline to control gate electrodes of the first and second selected memory cell transistors.

6. A method according to claim 1 wherein the positive program voltage is applied as a plurality of pulses with each pulse of the positive program voltage having a magnitude that is substantially constant relative to a reference voltage received from outside the memory device.

7. A method according to claim 1 wherein a negative voltage pulse of the plurality of negative voltage pulses is more negative than a preceding negative voltage pulse.

8. A method according to claim 1 wherein the positive pass voltage is applied to the control gate electrodes of the unselected memory cell transistors as a plurality of pulses with each pulse of the positive pass voltage having a magnitude that is substantially constant while applying the plurality of negative voltage pulses to the channel region.

9. A method according to claim 1 wherein applying the positive pass voltage to the control gate electrodes of the unselected memory cell transistors comprises applying increasing positive pass voltage pulses while applying successive negative voltage pulses to the channel region.

10. A method according to claim 1 wherein differences between magnitudes of the positive pass voltage and the positive program voltage remain substantially constant while applying successive negative voltage pulses to the channel region.

11. A method according to claim 1 wherein a first difference between magnitudes of the positive pass voltage and a first of the negative voltage pulses while applying the first of the negative voltage pulses to the channel region is different than a second difference between magnitudes of the positive pass voltages and a second of the negative voltage pulses while applying the second of the negative voltage pulses to the channel region.

12. A method of operating a memory device including a plurality of memory cell transistors serially coupled in a string between a string selection transistor and a ground selection transistor wherein the string selection transistor is coupled between the string and a bitline and wherein the ground selection transistor is coupled between the string and a common source line, the method comprising:

selecting one of the plurality of memory cell transistors in the string as a selected memory cell transistor for a program operation so that other memory cell transistors in the string are unselected;

during the program operation, applying a plurality of voltage pulses to a channel region of the selected memory cell transistor;

while applying the plurality of voltage pulses to the channel region, applying a pass voltage to control gate electrodes of the unselected memory cell transistors, wherein a difference between a voltage pulse applied to the channel region and the pass voltage applied to control gate electrodes of the unselected memory cell transistors changes with successive voltage pulses applied to the channel region; and while applying the plurality of voltage pulses to the channel region, applying a program voltage to a control gate electrode of the selected memory cell.

13. A method according to claim 12 wherein applying the plurality of voltage pulses to the channel region of the selected memory cell transistor comprises applying the plurality of voltage pulses through the bitline.

14. A method according to claim 12 wherein the memory cells, the string selection transistor, and the ground selection transistor are provided on a well region, and wherein applying the plurality of voltage pulses to the channel region of the selected memory cell transistor comprises applying the plurality of voltage pulses through the well region while the string selection transistor is turned off.

15. A method according to claim 12 wherein a difference between a voltage pulse applied to the channel region and the pass voltage applied to control gate electrodes of the unselected memory cell transistors increases with successive voltage pulses applied to the channel region.

16. A method according to claim 12 wherein applying the plurality of voltage pulses to the channel region comprises applying a plurality of negative voltage pulses to the channel region, and wherein applying the pass voltage to the control gate electrodes of the unselected memory cell transistors comprises applying a positive pass voltage to the control gate electrodes.

17. A method according to claim 12 wherein the program voltage is applied as a plurality of pulses with each pulse of the program voltage having a magnitude that is substantially constant relative to a reference voltage received from outside the memory device.

18. A method according to claim 12 wherein a voltage pulse of the plurality of voltage pulses is less than a preceding voltage pulse.

19. A method according to claim 12 wherein the pass voltage is applied to the control gate electrodes of the unselected memory cell transistors as a plurality of pulses with each pulse of the pass voltage having a magnitude that is substantially constant while applying the plurality of voltage pulses to the channel region.

20. A method according to claim 12 wherein applying the pass voltage to the control gate electrodes of the unselected memory cell transistors comprises applying increasing pass voltage pulses while applying successive voltage pulses to the channel region.

21. A method according to claim 12 wherein differences between magnitudes of the pass voltage and the program voltage remain substantially constant while applying successive voltage pulses to the channel region.

22. A method according to claim 12 wherein a first difference between magnitudes of the pass voltage and a first of the voltage pulses while applying the first of the voltage pulses to the channel region is different than a second difference between magnitudes of the pass voltage and a second of the voltage pulses while applying the second of the voltage pulses to the channel region.

23. An electronic device comprising:
   a memory cell array including a plurality of memory cell transistors serially coupled in a string between a string selection transistor and a ground selection transistor wherein the string selection transistor is coupled between the string and a bitline, and wherein the ground selection transistor is coupled between the string and a common source line; and
   a controller electrically coupled to the memory cell array, the controller configured to select one of the plurality of memory cell transistors in the string as a selected memory cell transistor for a program operation so that other memory cell transistors in the string are unselected, to apply a plurality of negative voltage pulses to a channel region of the selected memory cell transistor during the program operation, to apply a positive pass voltage to control gate electrodes of the unselected memory cell transistors while applying the plurality of negative voltage pulses to the channel region, and to apply a positive program voltage to a control gate electrode of the selected memory cell while applying the plurality of negative voltage pulses to the channel region.

24. An electronic device according to claim 23 further comprising:
   an interface electrically coupled to the controller wherein the interface provides a detachable electrical and mechanical coupling with a microprocessor.

25. An electronic device comprising:
   a memory cell array including a plurality of memory cell transistors serially coupled in a string between a string selection transistor and a ground selection transistor wherein the string selection transistor is coupled between the string and a bitline, and wherein the ground selection transistor is coupled between the string and a common source line; and
   a controller electrically coupled to the memory cell array, the controller configured to select one of the plurality of memory cell transistors in the string as a selected memory cell transistor for a program operation so that other memory cell transistors in the string are unselected, to apply a plurality of voltage pulses to a channel region of the selected memory cell transistor during the program operation, to apply a pass voltage to control gate electrodes of the unselected memory cell transistors while applying the plurality of voltage pulses to the channel region, wherein a difference between a voltage pulse applied to the channel region and the pass voltage applied to control gate electrodes of the unselected memory cell transistors changes with successive voltage pulses applied to the channel region, and to apply a program voltage to a control gate electrode of the selected memory cell while applying the plurality of voltage pulses to the channel region.

* * * * *